United States Patent
Park

(10) Patent No.: US 11,100,966 B2
(45) Date of Patent: Aug. 24, 2021

(54) ARRAY EDGE REPEATER IN MEMORY DEVICE

(71) Applicant: Winbond Electronics Corp., Taichung (TW)

(72) Inventor: San-Ha Park, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/739,099

(22) Filed: Jan. 9, 2020

(65) Prior Publication Data

US 2021/0217452 A1 Jul. 15, 2021

(51) Int. Cl.
| | | |
|---|---|---|
| *G11C 7/22* | (2006.01) | |
| *G11C 7/06* | (2006.01) | |
| *G11C 8/10* | (2006.01) | |
| *G11C 7/12* | (2006.01) | |
| *G11C 8/08* | (2006.01) | |
| *H03K 19/20* | (2006.01) | |

(52) U.S. Cl.
CPC ............. *G11C 7/22* (2013.01); *G11C 7/06* (2013.01); *G11C 7/12* (2013.01); *G11C 8/08* (2013.01); *G11C 8/10* (2013.01); *H03K 19/20* (2013.01)

(58) Field of Classification Search
CPC .... G11C 7/22; G11C 7/06; G11C 8/10; G11C 8/08; G11C 7/12; H03K 19/20
See application file for complete search history.

(56) References Cited

U.S. PATENT DOCUMENTS

| | | | |
|---|---|---|---|
| 5,128,897 A | 7/1992 | McClure | |
| 5,406,526 A | 4/1995 | Sugibayashi et al. | |
| 10,176,852 B2* | 1/2019 | Park ................. | G11C 7/1027 |
| 2004/0218419 A1* | 11/2004 | Perner .................. | G11C 11/16 |
| | | | 365/158 |
| 2008/0205177 A1* | 8/2008 | Kim ...................... | G11C 5/025 |
| | | | 365/205 |
| 2012/0147686 A1* | 6/2012 | Takayama ............... | G11C 7/12 |
| | | | 365/203 |
| 2014/0003113 A1* | 1/2014 | Seno ...................... | G11C 5/02 |
| | | | 365/51 |

OTHER PUBLICATIONS

Kinam Kim, "A SDR/DDR 4GB DRAM with 0.11um DRAM Technology." Journal of Semiconductor Technology and Science, vol. 1, No. 1, Mar. 2001, pp. 20-30.
"Office Action of Korea Counterpart Application" with English translation thereof, dated Nov. 17, 2020, p. 1-p. 9.

\* cited by examiner

*Primary Examiner* — Ajay Ojha
(74) *Attorney, Agent, or Firm* — JCIPRNET

(57) ABSTRACT

A memory device is provided. The memory device includes: a plurality of subarrays, a row control, a column control, a plurality of sense amplifiers, a plurality of sub word drivers, and a repeater. Each of the subarrays are electrically coupled to each other. The row control is configured to control at least a row of the subarrays. The column control is configured to control at least one column of the subarrays. The sense amplifiers are adapted to each of the subarrays are periodically enabled during a data access operation. The sub word drivers are disposed adjacent to each of the subarrays and provides a driving signal corresponds to the subarrays. The repeater is configured to disposed on the edge of the subarrays.

18 Claims, 5 Drawing Sheets

ARRAY EDGE REPEATER IN MEMORY DEVICE

BACKGROUND OF THE INVENTION

Technical Field

The present disclosure relates to a memory device, and more relates to an array edge repeater in the memory device.

Description of Related Art

Nowadays, in the field artificial intelligence AI, machine learning applications, the memory device is widely used. For those applications, the array size of the memory device is large which induces an array accessing speed degradation by using a long column selector line and a row selector line. As the development in the process technology, a total area of the memory device is reduced, results in increasing memory density. Increasing memory density induces the array accessing speed degradation by adopting a long parasitic capacitance and a parasitic resistance.

Several architectures have been proposed to overcome the array accessing speed degradation during a data access operation, for example each of a memory cells in the memory device are split into a plurality of banks. In another example, adding a repeater in the middle (center) of the memory cells to reduce a loading stress. By adopting the repeater in the memory device, reduces the loading of the column selector line transmitted to the memory banks from a column decoder and a row selector line transmitted to the memory banks from a row decoder. However, the array accessing speed degradation has been addressed by above architectures but increases a total area by using an additional dummy blocks in the memory device.

For example, referring to FIG. 1 illustrating a block diagram of a conventional memory device. The conventional memory device 100 includes a plurality of memory cells 110. Each of the memory cells 110 are split into a plurality of memory banks A~H and a corresponding plurality of column decoders 120, a plurality of row decoders 130 a plurality of sense amplifiers 140.

The memory array 100 further includes a repeater 150 is disposed in the center of the memory array. In detail, the repeater 150 is disposed between memory banks A~D and memory banks E~H.

Each of the memory banks A~H includes at least one column decoder 120, at least one row decoder 130, and at least one sense amplifier 140 to perform a data access operation in the memory banks A~H.

A layout structure of the memory device 100 as described above is well-known in the art, thus the detail description of the structure and operation are omitted herein.

Based on the above layout arrangements, each of the memory cells 110 need to split into the plurality of banks A~H, results in increasing a data lines (i.e., a bit line and a word line), the column decoders 120 and the row decoders 130 to access each memory banks A~H in the memory cells 110. Furthermore, an additional dummy blocks are needed in the memory cells 110 for an additional circuit, such as a peripheral circuit for accessing each memory banks A~H, results in increasing a chip size of the memory device 100.

Along with requirement of overcoming the array accessing speed degradation and no additional dummy blocks, it could be desirable to develop a memory device without splitting the memory cells into multiple banks and improving the array accessing speed in the memory cells for certain applications in this technical field.

SUMMARY OF THE INVENTION

The memory device of the disclosure includes a plurality of subarrays, a row control, a column control, a plurality of sense amplifiers, a plurality of sub word drivers, and a repeater. Each of the subarrays are electrically coupled to each other. The row control is configured to control at least one row of the subarrays. The column control is configured to control at least one column of the subarrays. The sense amplifiers are adapted to each of the subarrays are periodically enabled during a data access operation. The sub word drivers are disposed adjacent to each of the subarrays and provides a driving signal corresponds to the subarrays. The repeater is configured to disposed on the edge of the subarrays.

Based on the above, in the embodiments of the disclosure, the loading of the column selector line that is transmitted from the column decoder and the row selector line transmitted from the row decoder is improved, which results in improving the column accessing speed and the row accessing speed without splitting each of the memory cells into multiple banks. Furthermore, an additional dummy block is avoided by adopting the repeater at the edge of the subarrays.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

It is to be understood that other embodiment may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted," and variations thereof herein are used broadly and encompass direct and indirect connections, couplings, and mountings.

Figure 1:
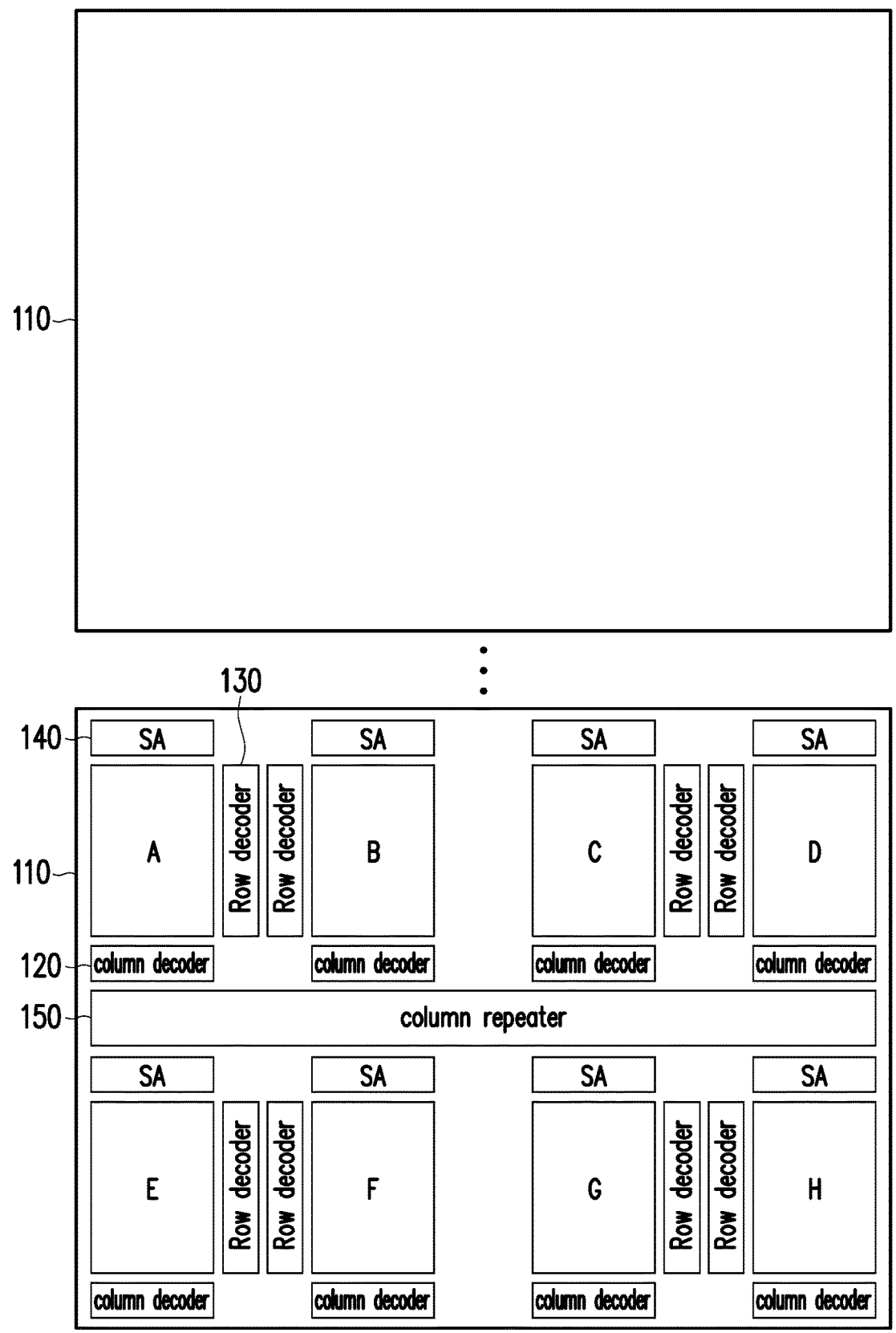
FIG. 1 illustrates a block diagram of conventional memory device.
Figure 2:
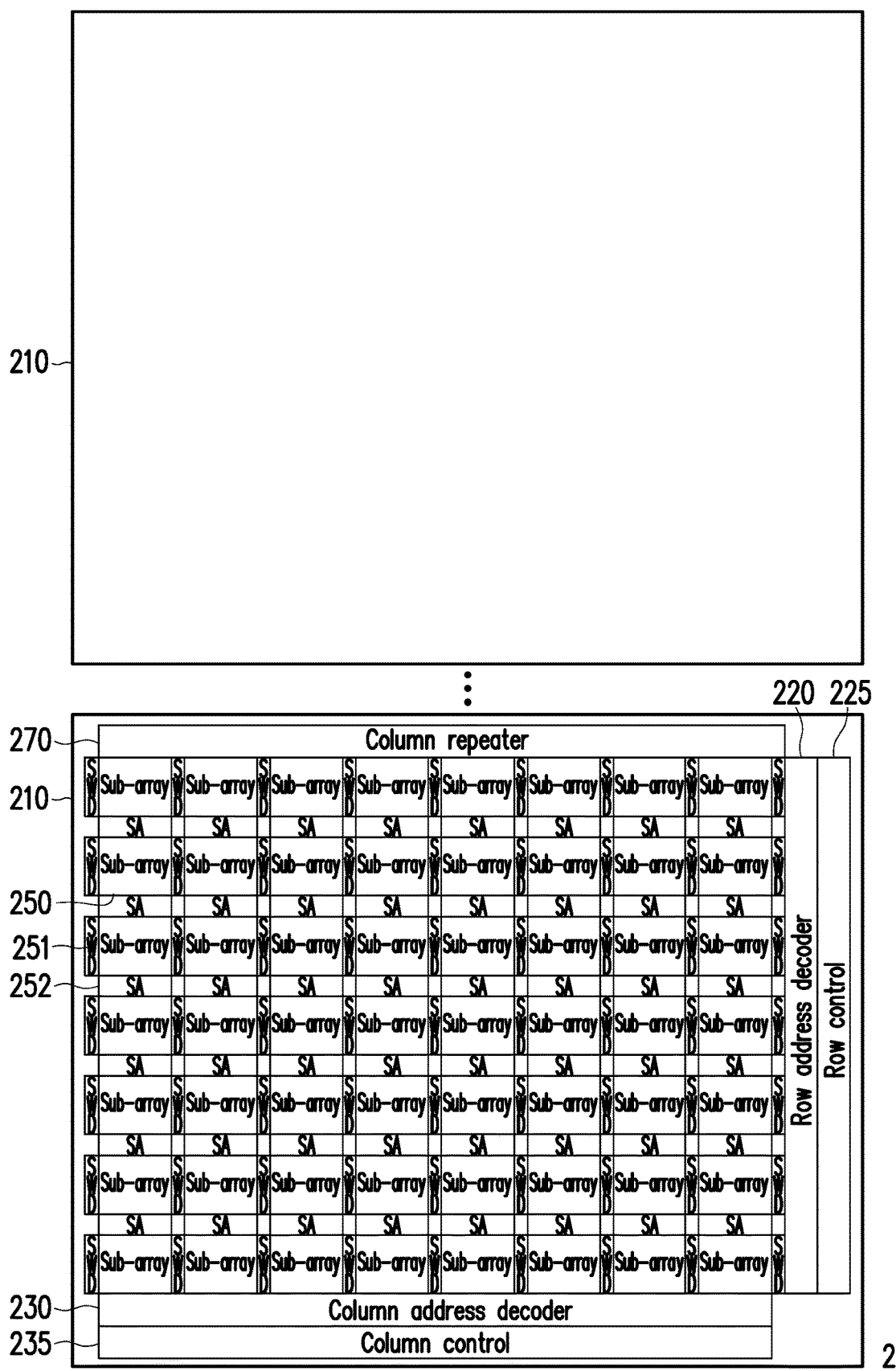
FIG. 2 illustrates a block diagram of a memory device according to an exemplary embodiment of the disclosure.

FIG. 2 illustrates a block diagram of a memory device according to an exemplary embodiment of the disclosure. Referring to FIG. 2, the memory device 200 includes a plurality of memory cells 210. Each of the memory cells 210 are sub-divided into a plurality of subarrays 250. A number of subarrays 250 in each of the memory cells 210 are determined according to the density of the memory device 200.

The memory device 200 may be a volatile memory device and/or a non-volatile memory device, thus a type of the memory device 200 is not limited in this disclosure. The memory device 200 includes multiple memory cells, typically 8 to 64 arrays in each memory cells. Typically, a size of the sub arrays 250 may be 16×8 Kb, 64×8 Kb, 512×8 Kb, but the size of the subarrays 250 in this disclosure is not limited thereto.

Each of the memory cells 210 further includes a row address decoder 220, a row control 225, a column address decoder 230, a column control 235, a plurality of sub word drivers (SWD) 251, a plurality of sense amplifiers (SA) 252, and a column repeater 270.

The subarrays 250 are coupled to a corresponding sub word drivers 251 and the sense amplifiers 252. The sub word drivers 251 are arranged adjacent to both sides of the subarrays 250, and are configured to provide a driving signal corresponding to the subarrays 250. The subarrays 250 which are internally connected by internal data bus, and a data movement and/or a data accessing operation between the subarrays 250 and be performed.

The row control 225 and the column control 235 may receive a control signal from an address register (not shown) to access the data corresponding to the subarrays 250. The row control 225 is configured to control a row of the subarrays 250. Similarly, the column control 235 is configured to control a column of the subarrays 250. The access data in this disclosure refers to a read operation, a write operation, and/or a backup operation. Thus, a function of access data in this disclosure is not limited. Based on the control signal from the address register to access the data, the row control 225 provides a row control signal to the row address decoder 220. On the other hand, the column control 235 provides a column control signal to the column address decoder 230.

The row address decoder 220 associates with each of the memory cells 210 are configured to select at least one row of the memory cells 210. Similarly, the column address decoder 230 associates with each of the memory cells 210 configured to select at least one column of the memory cells 210.

The sense amplifiers 252 are adapted to each of the subarrays 250. The sense amplifiers 252 are periodically enabled/disabled during the data accessing operation in the subarrays 250.

The column repeater 270 is disposed on an edge of the memory cells 210. Based on this arrangement, the memory cells 210 are not necessary to split into a plurality of banks and an array accessing speed of the memory cells 210 are improved.

Figure 3:
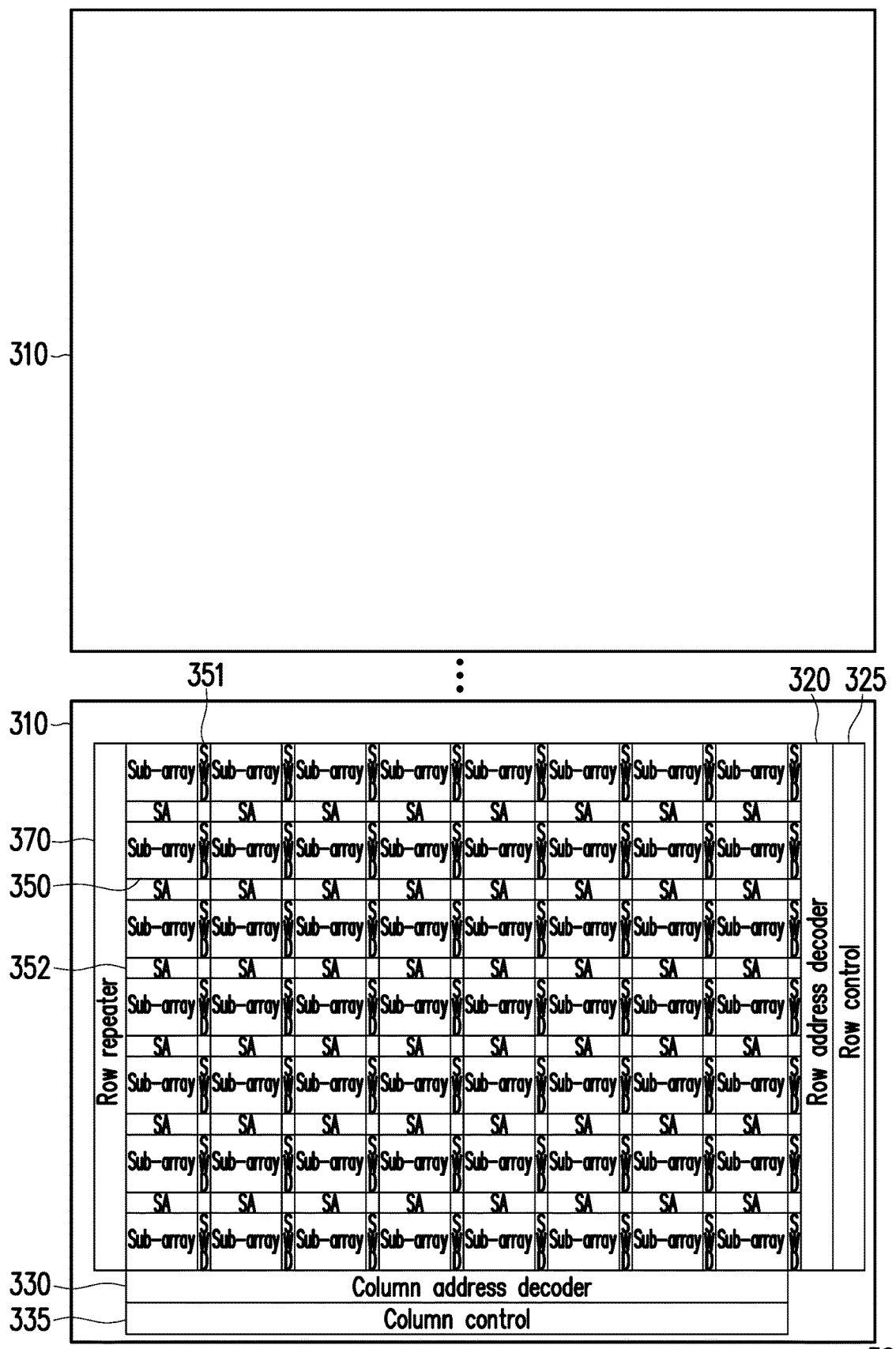
FIG. 3 illustrates a block diagram of a memory device according to an exemplary embodiment of the disclosure.

FIG. 3 illustrates a block diagram of a memory device according to an exemplary embodiment of the disclosure. Referring to FIG. 3, the memory device 300 includes a plurality of memory cells 310. Each of the memory cells 310 are divided into a plurality of subarrays 350.

Each of the memory cells 310 further includes a row address decoder 320, a row control 325, a column address decoder 330, a column control 335, a plurality of sub word drivers (SWD) 351, a plurality of sense amplifiers 352, and a row repeater 370. The row address decoder 320, the row control 325, the column address decoder 330, the column control 335, the sub word drivers 351, and the sense amplifiers 352 are respectively similar to a row address decoder 220, a row control 225, a column address decoder 230, a column control 235, a plurality of sub word drivers 251, and a plurality of sense amplifiers 252 with reference to FIG. 2, thus the detailed description of structure and operations of the row address decoder 320, the row control 325, the column address decoder 330, the column control 335, the sub word drivers 351, and the sense amplifiers 352 are omitted herein.

The row repeater 370 is disposed on an edge of the memory cells 310. Based on this arrangement, the memory cells are not necessary to split into a plurality of banks and the array accessing speed of the memory cells 310 are improved.

Figure 4:
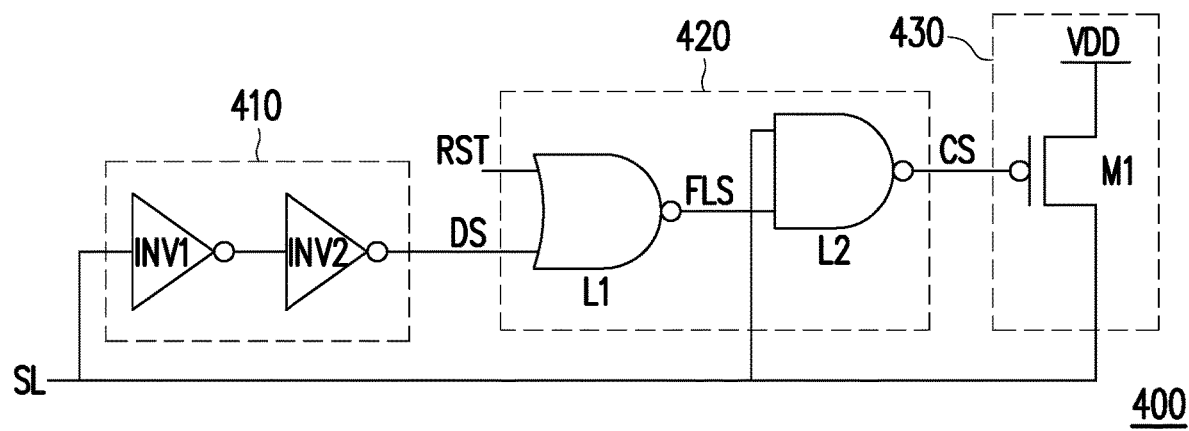
FIG. 4 illustrates a circuit diagram of a repeater according to an exemplary embodiment of the disclosure.

FIG. 4 illustrates a circuit diagram of a repeater according to an exemplary embodiment of the disclosure. The repeater 400 includes a delay circuit 410, a logic circuit 420, and a pull-up transistor 430.

The delay circuit 410 includes two inverters INV1~INV2. The delay circuit 410 receives a selector signal from a selector line SL and generates a delay signal DS. In detail, the inverter INV1 receives the selector signal from selector line SL and generates an output, and the inverter INV2 receives the output from the inverter INV1 and generates the delay signal DS. In this embodiment, the number of inverters in the delay circuit 410 is two inverters (INV1, INV2) connected in series. However, in some embodiments, the number of inverters is more than two. The time delay of the delay signal DS is varied by choosing number of inverters in the delay circuit 410.

The logic circuit 420 includes two logic gates L1~L2. In this embodiment, the logic gate L1 is a 2-input NOR gate and the logic gate L2 is a 2-input NAND gate. The logic gate L1 and the logic gate L2 are connected in series. The logic circuit 420 is configured to receive the delay signal DS from the delay circuit 410 and generates a control signal CS. In detail, the logic gate L1 receives the delay signal DS as one input and another input is a reset signal RST to generate a logic signal FLS. Then, the logic gate L2 receives the logic signal FLS from the logic gate L1 as one input and another input is the selector signal from the selector line SL to generate the control signal CS. In some embodiments, the logic gates L1~L2 may be any logic gates such as AND, OR, NOT, EXOR, EXNOR, Flip flops, and so on. Hence the logic gates L1~L2 in this disclosure is not limited thereto.

In this embodiment, the pull-up transistor 430 includes a P-MOS transistor M1. The P-MOS transistor M1 has a gate terminal, a source terminal and a drain terminal. The source terminal is coupled to a power supply VDD, the drain terminal is coupled to the selector line SL and the gate terminal is coupled to the logic circuit 420. The pull-up transistor 430 is configured to receive the control signal CS from the logic circuit 420 and a data accessing in a memory device is performed by a row address decoder 220 and a column address decoder 230 with reference to FIG. 2. In detail, the control terminal of the pull-up transistor 430 receives the control signal CS from the logic gate L2 and performs a data accessing in the memory device.

In one embodiment, with reference to FIG. 2, the selector signal from the selector line SL received by the delay circuit 410, the logic circuit 420 and the pull-up transistor 430 may be a column selector line for accessing at least one column in the memory device.

In one embodiment, with reference to FIG. 3, the selector signal from the selector line SL received by the delay circuit 410, the logic circuit 420 and the pull-up transistor 430 may be a row selector line for accessing at least one row in the memory device.

By this configuration, the loading to a column selector line transmitted from the column decoder and a row selector line transmitted from the row decoder is improved, which results in improving a column accessing speed and a row accessing speed without splitting each of the memory cells into multiple banks in the memory device.

Figure 5:
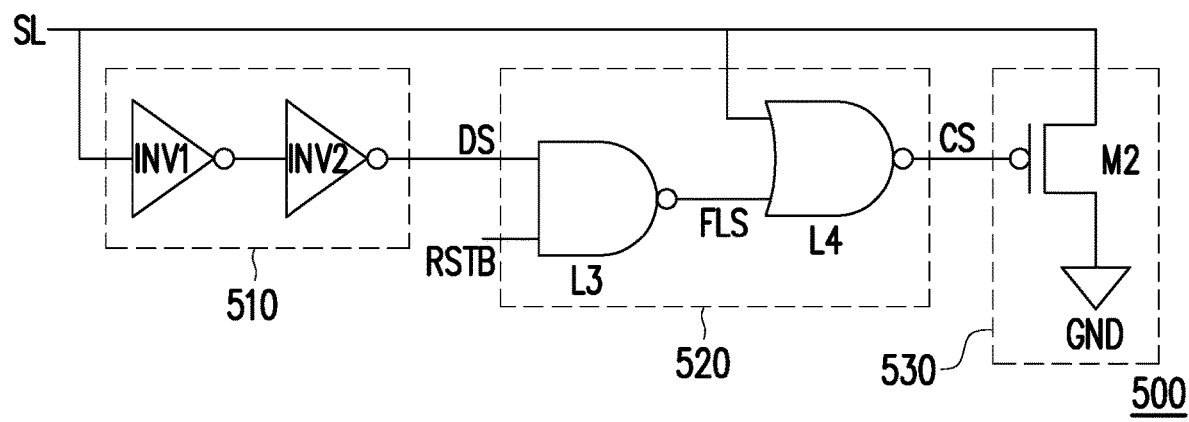
FIG. 5 illustrates a circuit diagram of a repeater according to an exemplary embodiment of the disclosure.

FIG. 5 illustrates a circuit diagram of a repeater according to an exemplary embodiment of the disclosure. The repeater 500 includes a delay circuit 510, a logic circuit 520, and a pull-down transistor 530.

The delay circuit 510 and the logic circuit 520 are respectively similar to a delay circuit 410 and a logic circuit 420 with reference to FIG. 4, thus the detailed description of structure and operations of the delay circuit 510 and the logic circuit 520 are omitted herein.

The logic circuit 520 includes logic gates L3~L4. In this embodiment, the logic gate L3 is a 2-input NAND gate and the logic gate L4 is a 2-input NOR gate. Similarly, the logic circuit 520 is configured to receive the delay signal DS from the delay circuit 510 and generates a control signal CS. In detail, the logic gate L3 receives the delay signal DS as one input and another input is a reset signal RSTB to generate a logic signal FLS. The logic gate L4 receives the logic signal FLS from the logic gate L3 as one input and another input is a selector signal from the selector line SL to generate a control signals CS.

In this embodiment, the pull-down transistor 530 includes a N-MOS transistor. The N-MOS transistor M2 has a gate terminal, a source terminal and a drain terminal. The source terminal is coupled to a ground potential GND, the drain terminal is coupled to the selector line SL and the gate terminal is coupled to the logic circuit 520.

The pull-down transistor 530 is configured to receive a control CS from the logic circuit 520 and a data accessing in a memory device is performed by a row decoder 220 and a column address decoder 230 with reference to FIG. 2. In detail, the control terminal of the pull-down transistor 430 receives the control signal CS from the logic gate L4 and performs a data accessing in the memory device.

In one embodiment, with reference to FIG. 2, the selector signal from the selector line SL received by the delay circuit 510, the logic circuit 520 and the pull-up transistor 530 may be a column selector line for accessing at least one column in the memory device.

In one embodiment, with reference to FIG. 3, the selector signal from the selector line SL received by the delay circuit 510, the logic circuit 520 and the pull-up transistor 530 may be a row selector line for accessing at least one row in the memory device.

Figure 6:
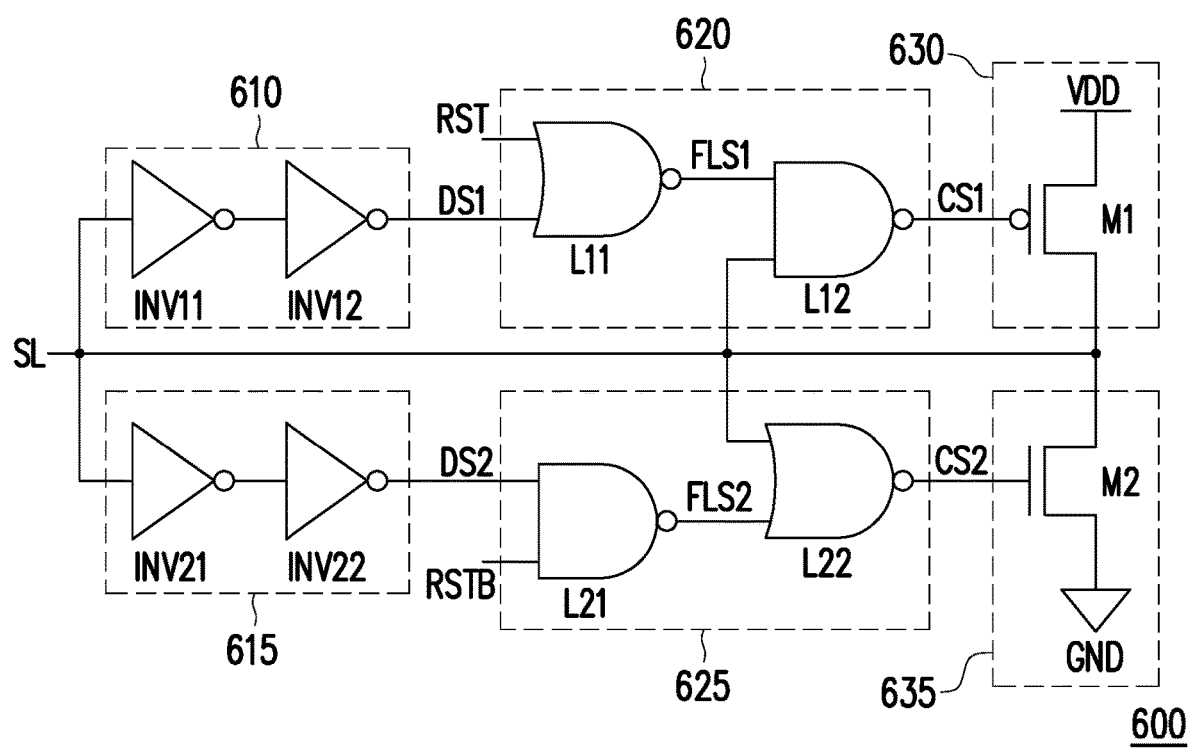
FIG. 6 illustrates a circuit diagram of a repeater according to an exemplary embodiment of the disclosure.

FIG. 6 illustrates a circuit diagram of a repeater according to an exemplary embodiment of the disclosure. The repeater 600 includes a plurality of delay circuits 610 and 615, a plurality of logic circuits 620 and 625, a pull-up transistor 630, and a pull-down transistor 635.

The delay circuits 610 and 615 are configured to receive the selector signal from the selector line SL and generate corresponding delay signals DS1 and DS2.

The logic circuit 620 receives the delay signal DS1 and generates a control signal CS1. Similarly, the logic circuit 625 receives the delay signal DS2 and generates a control signal CS2. The logic circuit 620 includes logic gates L11~L12. Similarly, the logic circuit 625 includes logic gates L21~L22.

The logic gate L11 receives the delay signal DS1 from the delay circuit 610 as one input and another input as reset signal RST to generate a logic signal FLS1. The logic gate L12 receives the logic signal FLS1 as one input and another input as the selector signal from the selector line SL to generate the control signal CS1 to drive the pull-up transistor M1. Similarly, the logic gate L21 receives the delay signal DS2 from the delay circuit 615 as one input and another input as reset signal RSTB to generate a logic signal FLS2. The logic gate L22 receives the logic signal FLS2 as one input and another input as the selector signal from the selector line SL to generate the control signal CS2 to drive the pull-down transistor M2.

The pull-up transistor 630 receives the control signal CS1 from the logic circuit 620 and the pull-down transistor 625 receives the control signal CS2 from the logic circuit 625.

The delay circuit 610, the logic circuit 620 and the pull-up transistor 630 are respectively similar to the delay circuit 410, the logic circuit 420 and the pull-up transistor 430 with reference to FIG. 4. Besides, the delay circuit 615, the logic circuit 625 and the pull-down transistor 635 are respectively similar to the delay circuit 510, the logic circuit 520 and the pull-down transistor 530 with reference to FIG. 5, thus the detailed descriptions are omitted herein.

In summary, in the embodiments of the disclosure based on the layout arrangements, the loading of a column selector line that is transmitted from the column decoder and a row selector line transmitted from the row decoder is improved, which results in improving the column accessing speed and the row accessing speed without splitting each of the memory cells into multiple banks in the memory device.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:
1. A memory device, comprising:
an array of memory cells, comprising a plurality of subarrays, wherein each of the subarrays are electrically coupled to each other;
a row control, configured to control at least one row of the subarrays;
a column control, configured to control at least one column of the subarrays;
a plurality of sense amplifiers, adapted to each of the subarrays are periodically enabled during a data access operation;
a plurality of sub word drivers, disposed adjacent to each of the subarrays and provides a driving signal corresponds to the subarrays; and
a repeater, disposed at an edge of the array of the memory cells, wherein the repeater directly contacts the edge of the array of the memory cells, wherein the repeater comprises:
a delay circuit, comprising a plurality of inverters connected in series, wherein the delay circuit is configured to receive a selector signal during the data access operation and generates a delay signal; and
a logic circuit, configured to receive the delay signal and generates a control signal.

2. The memory device of claim 1, wherein the delay circuit comprises:
   a first logic gate, configured to receive a reset signal and the delay signal to generate a first logic signal; and
   a second logic gate, configured to receive the first logic signal and the selector signal to generate the control signal,
   wherein the first logic gate and the second logic gate are connected in series.

3. The memory device of claim 1, wherein the repeater is a column repeater, configured to access at least one column of the memory device by using a column selector line.

4. The memory device of claim 1, wherein the repeater is a row repeater, configured to access at least one row of the memory device by using a row selector line.

5. The memory device of claim 1, wherein the repeater is a pull-up repeater.

6. The memory device of claim 5, wherein the repeater further comprises:
   a pull-up transistor, configured to receive the control signal from the logic circuit.

7. The memory device of claim 6, wherein the pull-up transistor comprises:
   a source terminal, coupled to a power supply;
   a drain terminal, coupled to the selector signal; and
   a control terminal, coupled to an output of the logic circuit.

8. The memory device of claim 6, wherein the logic circuit comprises:
   a first logic gate, wherein the first logic gate is a 2-input NOR gate; and
   a second logic gate, wherein the second logic gate is a 2-input NAND gate.

9. The memory device of claim 1, wherein the repeater is a pull-down repeater.

10. The memory device of claim 9, wherein the repeater further comprises:
    a pull-down transistor, configured to receive the control signal from the logic circuit.

11. The memory device of claim 10, wherein the pull-down transistor comprises:
    a source terminal, coupled to a ground;
    a drain terminal, coupled to the selector signal; and
    a control terminal, coupled to an output of the logic circuit.

12. The memory device of claim 10, wherein the logic circuit comprises:
    a first logic gate, wherein the first logic gate is a 2-input NAND gate; and
    a second logic gate, wherein the second logic gate is a 2-input NOR gate.

13. The memory device of claim 1, wherein the repeater is a push-pull repeater.

14. The memory device of claim 13, wherein the repeater further comprises:
    a plurality of delay circuits, wherein each of the delay circuits comprising a plurality of inverters connected in series;
    a plurality of logic circuits, wherein each of the logic circuits configured to receive a delay signal corresponds to each of the delay circuits and generates a first control signal and a second control signal;
    a pull-up transistor, configured to receive the first control signal from the logic circuits; and
    a pull-down transistor, configured to receive the second control signal from the logic circuits.

15. The memory device of claim 14, wherein the delay circuits comprise:
    a first delay circuit, configured to receive a selector signal during the data access operation and generates a first delay signal; and
    a second delay circuit, configured to receive the selector signal during the data access operation and generates a second delay signal.

16. The memory device of claim 15, wherein the logic circuits comprise:
    a first logic circuit, configured to receive the first delay signal and generates a first control signal; and
    a second logic circuit, configured to receive the second delay signal and generates a second control signal.

17. The memory device of claim 14, wherein the pull-up transistor comprises:
    a source terminal, coupled to a power supply;
    a drain terminal, coupled to the selector signal; and
    a control terminal, coupled to an output of the logic circuit.

18. The memory device of claim 14, wherein the pull-down transistor comprises:
    a source terminal, coupled to a ground;
    a drain terminal, coupled to the selector signal; and
    a control terminal, coupled to an output of the logic circuit.

* * * * *